(12) United States Patent
Harley

(10) Patent No.: US 10,573,763 B2
(45) Date of Patent: Feb. 25, 2020

(54) SOLAR CELL HAVING A PLURALITY OF SUB-CELLS COUPLED BY A METALLIZATION STRUCTURE HAVING A METAL BRIDGE

(71) Applicant: SUNPOWER CORPORATION, San Jose, CA (US)

(72) Inventor: Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 451 days.

(21) Appl. No.: 14/983,345

(22) Filed: Dec. 29, 2015

(65) Prior Publication Data

US 2017/0186885 A1 Jun. 29, 2017

(51) Int. Cl.
 *H01L 31/02* (2006.01)
 *H01L 31/18* (2006.01)

(52) U.S. Cl.
 CPC ...... *H01L 31/0201* (2013.01); *H01L 31/1876* (2013.01)

(58) Field of Classification Search
 None
 See application file for complete search history.

(56) References Cited

U.S. PATENT DOCUMENTS

| | | |
|---|---|---|
| 5,164,019 A | 11/1992 | Sinton |
| 2008/0216887 A1 | 9/2008 | Hacke et al. |
| 2008/0223437 A1 | 9/2008 | De Ceuster |
| 2010/0101633 A1 | 4/2010 | Park et al. |
| 2011/0186107 A1 | 8/2011 | Gibson et al. |
| 2011/0214714 A1 | 9/2011 | Aberle et al. |
| 2012/0204938 A1 | 8/2012 | Hacke et al. |
| 2015/0349153 A1* | 12/2015 | Morad ............... H01L 31/05 136/256 |

OTHER PUBLICATIONS

International Preliminary Report on Patentability from PCT/US2016/066731, dated Jul. 3, 2018, 11 pages.
International Search Report and Written Opinion for Pot Patent Application No. PCT/US16/66731 dated Apr. 7, 2017, 16 pgs.

* cited by examiner

*Primary Examiner* — Shannon M Gardner
(74) *Attorney, Agent, or Firm* — Schwabe, Williamson & Wyatt, P.C.

(57) ABSTRACT

Solar cells having a plurality of sub-cells coupled by metallization structures having a metal bridge, and singulation approaches to forming solar cells having a plurality of sub-cells coupled by metallization structures, are described. In an example, the metal bridge can provide structural support and provide for an electrical connection between a first contact pad and a first busbar. Adjacent ones of the singulated and physically separated semiconductor substrate portions have a groove there between and where the metal bridge can be perpendicular to the groove. The solar cell can include a first contact pad adjacent to a second contact pad.

15 Claims, 8 Drawing Sheets

SOLAR CELL HAVING A PLURALITY OF SUB-CELLS COUPLED BY A METALLIZATION STRUCTURE HAVING A METAL BRIDGE

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" sub-cell does not necessarily imply that this sub-cell is the first sub-cell in a sequence; instead the term "first" is used to differentiate this sub-cell from another sub-cell (e.g., a "second" sub-cell). As used herein, sub-cells refer to physically separated portions of a solar cell, where one sub-cell (e.g., a first sub-cell) can be coupled by a metallization structure to another, different, physically separated sub-cell (e.g., second sub-cell). Thus, as used herein, a solar cell can refer to a collection of sub-cells, e.g., a plurality of sub-cells connected by a metallization structure.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Disclosed herein are solar cells having a plurality of sub-cells coupled by metallization structures. In an embodiment, a solar cell, includes a plurality of sub-cells, each of the sub-cells having a singulated and physically separated semiconductor substrate portion. Adjacent ones of the singulated and physically separated semiconductor substrate portions have a groove there between. The solar cell also includes a monolithic metallization structure. A portion of the monolithic metallization structure couples ones of the plurality of sub-cells. The groove between adjacent ones of the singulated and physically separated semiconductor substrate portions exposes a portion of the monolithic metallization structure. As used herein, the monolithic metallization structure can also be referred to as a metallization structure.

Solar cells having a plurality of sub-cells coupled by metallization structures, and singulation approaches to forming solar cells having a plurality of sub-cells coupled by metallization structures, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as solar cell emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Figure 1A:
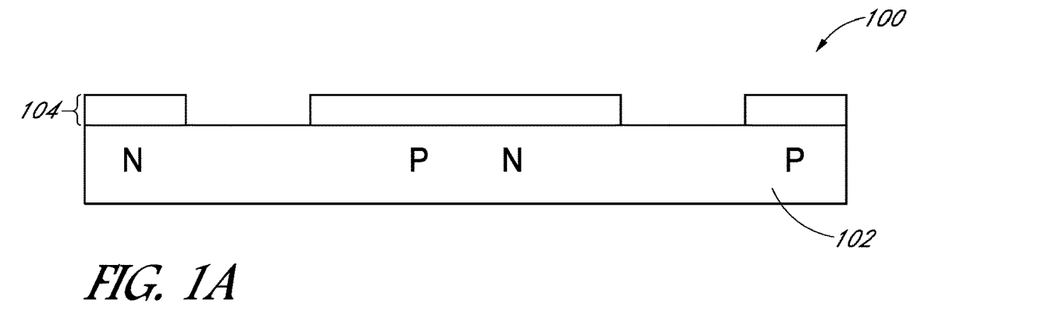
FIG. 1A illustrates a cross-sectional view of a solar cell prior to singulation to form physically separated sub-cells, in accordance with an embodiment of the present disclosure.
Figure 1B:
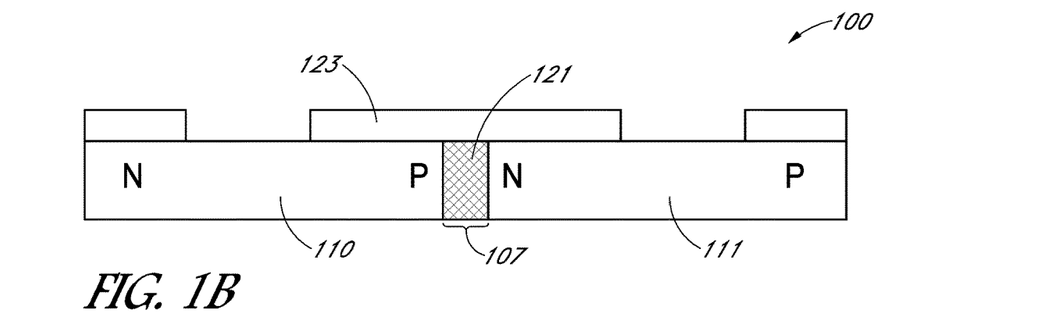
FIG. 1B illustrates a cross-sectional view of a solar cell subsequent to singulation to form physically separated sub-cells, in accordance with an embodiment of the present disclosure.

As an exemplary representation of the concepts involved herein, FIGS. 1A and 1B illustrate cross-sectional views of a solar cell prior to and subsequent to, respectively, singulation to form physically separated sub-cells, in accordance with an embodiment of the present disclosure.

Referring to FIG. 1A, a solar cell 100 includes a substrate 102 having a metallization structure 104 disposed thereon. The solar cell 100 includes alternating N-type and P-type regions in or above the substrate 102. In one embodiment, the metallization structure 104 is a monolithic metallization structure, also referred herein as metallization structure. In an embodiment, the metallization structure 104 can have a thickness of greater than approximately 25 microns. In some embodiments, the metallization structure 104 can be configured to prevent power loss otherwise associated with silicon cracking in a solar cell by holding sub-cells together. In an example, the metallization structure 104 can provide mechanical and/or structural support between sub-cells. Embodiments described herein provide a metallization structure (e.g., by plating, or foil, or ribbon, etc.) that is bonded to individual sub-cells. In an embodiment, the metallization structure 104 can include a plated metal or a metal foil. In an example, the metallization structures described herein can include copper or aluminum. (e.g., plated copper or an aluminum foil). The metallization structure 104 is patterned such that sub-cell interconnects, e.g., portions 123 of the metallization structure, are formed in the same operation as the metallization structure 104.

Referring to FIG. 1B, the solar cell 100 has been singulated or diced to provide sub-cells 110 and 111 which are physically separated from one another. In one embodiment, the solar cell 100 is singulated using laser ablation. In an embodiment, the laser can use a shorter pulse-lengths (e.g., less than approximately 10 nanoseconds), and processes that stop short of disrupting a rear dielectric (e.g., a groove 107 followed by mechanical separation). In an embodiment, a resulting groove 107 formed upon singulation is filled with an encapsulant material 121, as is depicted in FIG. 1B. In an embodiment, as is also depicted in FIG. 1B, a portion 123 of the metallization structure 104 bridges the two sub-cells 110 and 111. In a particular embodiment, the sub-cells 110 and 11 can provide series or parallel diode structures.

Figure 2:
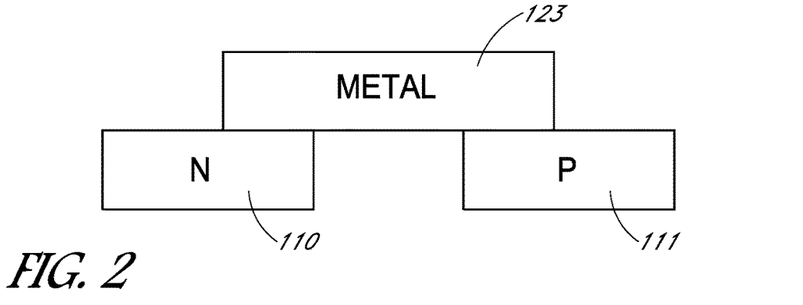
FIG. 2 illustrates a cross-sectional view of a portion of a pair of singulated sub-cells using metal as a back-stop for cell singulation, in accordance with an embodiment of the present disclosure.

Referring again to FIGS. 1A and 1B, the portion 123 of the metallization structure 104 is used as both mechanical support and a back-stop during dicing, e.g., during laser ablation of the substrate 102 material. In a first particular example, FIG. 2 illustrates a cross-sectional view of a portion of a pair of singulated sub-cells using metal as a back-stop for cell singulation, in accordance with an embodiment of the present disclosure. Referring to FIG. 2, the sub-cells 110 and 111 are formed upon singulation of the substrate 102, having the groove 107 there between. Referring to FIGS. 1 and 2, the portion 123 of the metallization structure 104 is formed directly on the back surface of substrate 102 and, as such, a metal or metallic region 123 is used as a back-stop during singulation.

Figure 3:
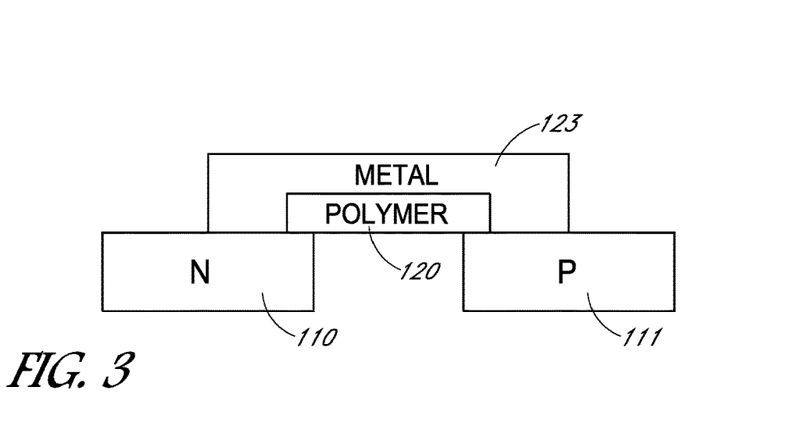
FIG. 3 illustrates a cross-sectional view of a portion of a pair of singulated sub-cells using a polymer or other non-metal as a back-stop for cell singulation, in accordance with an embodiment of the present disclosure.

In a second particular example, FIG. 3 illustrates a cross-sections view of a portion of a pair of singulated sub-cells 110, 111 using a buffer material 120 as a back-stop for cell singulation, in accordance with an embodiment of the present disclosure. Referring to FIGS. 1A, 1B, 2 and 3, the sub-cells 110 and 111 are formed upon singulation of the substrate 102, having the groove 107 there between. However, the portion 123 of the metallization structure 104 is formed on a polymer region 120, which in turn is formed directly on the back surface of substrate 102 and, as such, polymeric or other metal or non-metal region is used as a back-stop during singulation. In an example embodiment, laser damage can be eliminated or at least mitigated by using a buffer material as an ablation stop, such that the metal is not directly scribed. In an embodiment, the buffer material can include an inorganic laser buffer (e.g., titanium oxide) or an encapsulating material, e.g., ethylene vinyl alcohol (EVA), poly-olefin, disposed in the groove. In other embodiments, such a buffer material can be include of a dielectric material such as, but not limited to, silicon dioxide (SiO2), silicon nitride (SiN) or silicon oxynitride (SiON). In one such embodiment, the dielectric material can be formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD). In an embodiment, an encapsulant can be used to fill a groove between individual silicon portions or sub-cells 110, 111 in order to mitigate the risk of shunting and wear of the silicon. In one such embodiment, a metal-tolerant passivation material can be used as a primary or secondary anti-reflective coating (ARC) layer.

In either of the cases of FIGS. 1A, 1B, 2 and 3, it is to be appreciated that, in an embodiment, the metallization structure 104 can be viewed as a monolithic metallization structure, as described in greater detail below. Furthermore, in an embodiment, in either case, a sub-cell interconnect 123 is fabricated in a same operation as the metallization structure 104. Alternatively, a sub-cell interconnect 123 may be externally applied, but additional processing operations would be needed.

In an embodiment, the metallization structure 104 can be fabricated from a foil (e.g., a conductive foil, such as an aluminum foil with or without an additional seed layer) or is fabricated by a plating process. In one such embodiment, in the case that a relatively thick (e.g., greater that approximately 25 microns) back metal is used, some tolerance for partial laser ablation into the metal may be accommodated. However, if a thin metallization structure is used (e.g., less than approximately 25 microns), ablation may need to be halted without any scribing of the metallization structure, so as to maintain the electrical and physical integrity of the metal required to survive reliability testing. The metallization structure may be fabricated by plating, printing, by use of a bonding procedure (e.g., metal bonding process as in the case of a foil), or may be patterned by a deposition, lithographic, and etch approach.

In accordance with an embodiment of the present disclosure, each of the singulated and physically separated semiconductor substrate portions (e.g., sub-cells) is a bulk monocrystalline silicon substrate portion, such as fabricated from an N-type monocrystalline substrate. In one such embodiment, each silicon portion includes one or more N+ regions (e.g., phosphorous or arsenic doped regions) and one or more P+ regions (e.g., boron doped regions) formed in substrate itself. In other embodiments, each silicon portion includes one or more polycrystalline silicon N+ regions and one or more polycrystalline silicon P+ regions formed above a silicon substrate.

Figure 4:
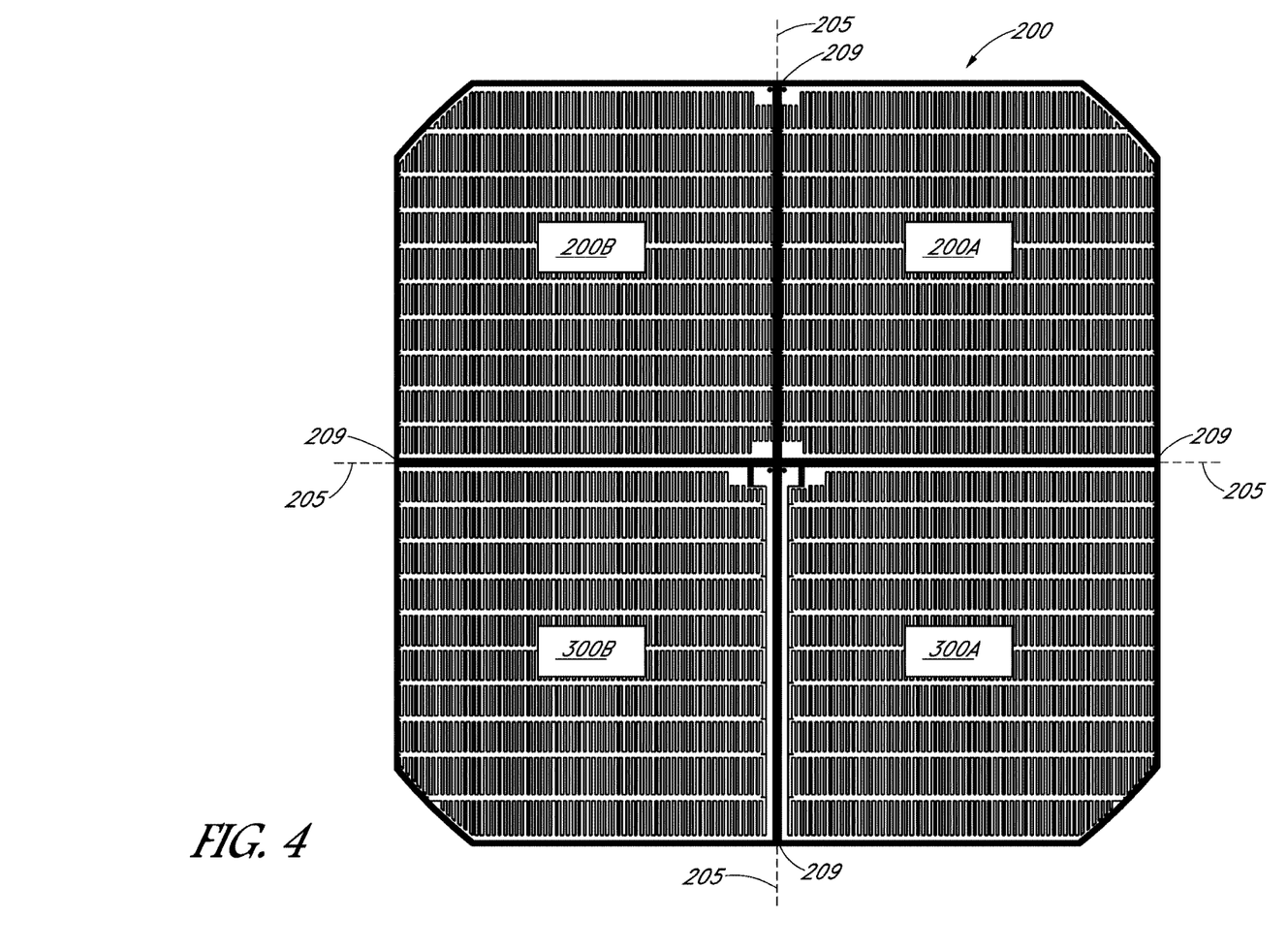
FIG. 4 illustrates a plan view from the metallization side of a solar cell prior to dicing to form a plurality of sub-cells, in accordance with an embodiment of the present disclosure.

FIG. 4 illustrates a plan view from the metallization side of a solar cell 200 prior to dicing into the solar cells 200A, 200B, 300A, 300B, in accordance with an embodiment of the present disclosure. A dashed line 205 in FIG. 4 illustrates where the dicing is performed. As shown, the dicing is performed to separate the groups of sub-cells 200A, 200B, 300A, 300B. In an example, the dicing is performed on exposed regions 209 of the solar cell 200 between adjacent solar cells. As discussed in detail below, FIG. 5 illustrates an exemplary embodiment 200A of the top groups of sub-cells 200A, 200B while FIG. 6 illustrates an exemplary embodiment 300A of the bottom groups of sub-cells 300A, 300B.

Figure 5:
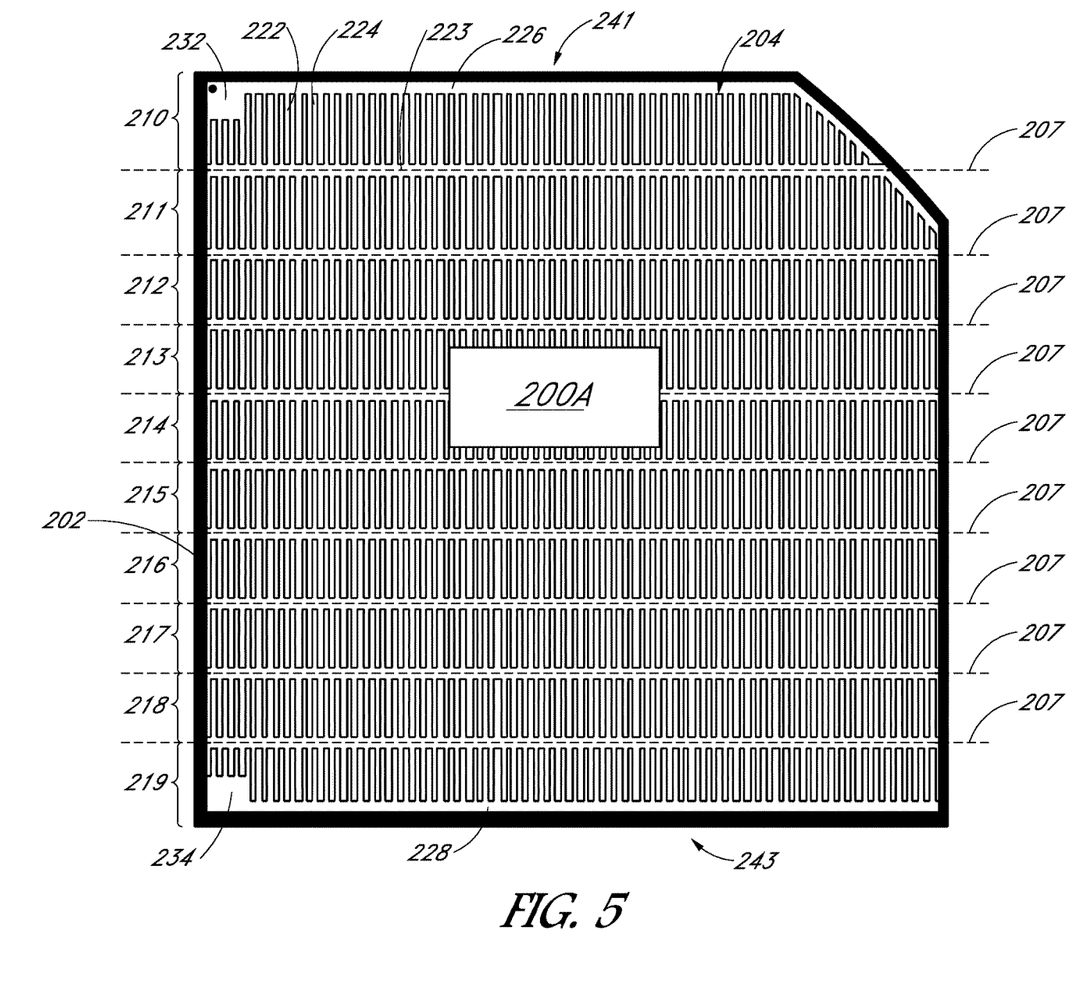
FIG. 5 illustrates a plan view from the metallization side of a solar cell that has been diced into a series of ten connected sub-cells, in accordance with an embodiment of the present disclosure.
Figure 6:
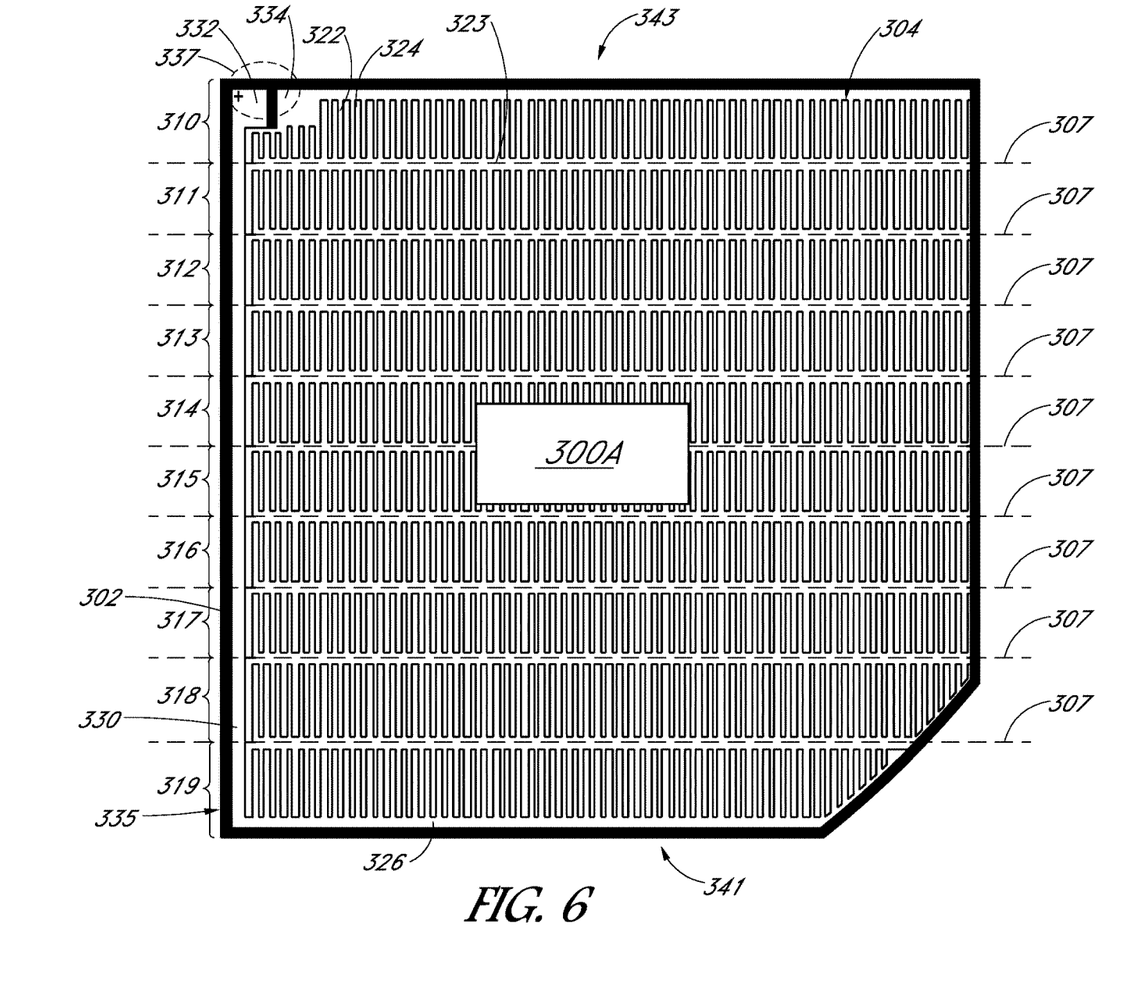
FIG. 6 illustrates a plan view from the metallization side of another solar cell that has been diced into a series of ten connected sub-cells, in accordance with an embodiment of the present disclosure.

Referring to FIG. 5, a plan view from a metallization side of a solar cell that has been diced into ten connected sub-cells is shown, in accordance with an embodiment of the present disclosure. In an embodiment, the solar cell 200A can include a metallization structure 204 corresponding to the metallization structure of 104 of FIGS. 1-3. The metallization structure 204 can include a first and second busbar 226, 228. In an embodiment, the solar cell 200A can include a first and second contact pad 232, 234. In an embodiment, the first busbar 226 can include the first contact pad 232 and the second busbar 228 can include the second contact pad 234. In an embodiment, the contact pads 232, 234 can be of opposite polarity (e.g., positive and/or negative contact pads respectively).

With reference to FIG. 5, the solar cell 200A can be singulated to provide ten sub-cells 210-219. In an embodiment, the sub-cell 210 can include the first busbar 226 and first contact pad 232. In an embodiment, the sub-cell 219 can include the second busbar 228 and the second contact pad 234. In an embodiment, the first busbar 226 can be located at a first location 241 and the second busbar 228 can be located at a second, different, location 243. In an example, as shown in FIG. 5, the first busbar 226 can be located at an upper side 241 and the second busbar 228 can be located at a lower side 243 of the solar cell 200A.

Although, ten sub-cells are shown, multiple sub-cells can be used, e.g., the solar cell 200A can include one, two, three, more or less sub-cells. The metallization structure 204 can include a portion 223 used to hold the multi-cell design together where each of the sub-cells meet (e.g., along the groove 207). The portion 223 of the metallization structure 204 can correspond to the portion 223 of the metallization structure of 104 of FIGS. 1-3. In one embodiment, a groove 207 marks the separation region between individual sub-cells 210-219, where the portion 223 of the metallization structure 204 connect the sub-cells 210-219. The groove 207 of the metallization structure 204 corresponds to the groove 107 of the metallization structure of 104 of FIGS. 1-3. The metallization structure 204 can include contact fingers 222, 224. In an embodiment, the contact fingers 222, 224 can be of opposite polarity (e.g., positive and/or negative contact fingers respectively). In an embodiment, the first contact pad 232 can be located at a first location 241 and the second contact pad 232 can be located at a second, different, location 243. In an example, as shown in FIG. 5, the first contact pad 232 can be located at an upper side 241 and the second contact pad 234 can be located at a lower side 243 of the solar cell 200A.

Referring again to FIG. 5, the voltage of the solar cell 200A can be 10× of an individual sub-cell. In an example, the solar cell 200A can have a combined voltage of approximately 6.3Vmp, where each sub-cell of 210-219, can have a voltage of approximately 0.63V. The current of the solar cell is approximately $1/10$th the current of the original cell 200 of FIG. 4 (e.g., about 0.5 A). The solar cell 200A, in an embodiment, can be used directly to power a DC device, such as a battery, motor, light, sensor, transmitter, receiver, or USB port for consumer charging applications.

FIG. 6, illustrates a plan view from the metallization side of another solar cell that has been diced into ten connected sub-cells, in accordance with an embodiment of the present disclosure. In an embodiment, the solar cell 300A is substantially similar to the solar cell 200A of FIG. 5. As shown, the solar cell 300A has similar reference numbers to elements of the solar cell 200A where like reference numbers refer to similar elements throughout the figures. In an embodiment, the structure of the solar cell 300A is substantially similar to the structure of the solar cell 200A of FIG. 5, except as described below. In an example, the solar cell 300A can include a metal bridge 330 located along an edge 335 of a substrate 302, where the metal bridge 330 can provide structural support and provide for an electrical connection between a first contact 332 pad and a first bus bar 326. Therefore the description of corresponding portions of FIG. 5 applies equally to the description of FIG. 6. In an embodiment, the solar cell 300A can include a metallization structure 304 corresponding to the metallization structure of 104 of FIGS. 1-3.

Regions of reduced light absorption and/or electrical collection of a solar cell can be referred to as dead-space regions. In an example, edges of the solar cell and/or regions of the solar cell near the edges can be dead-space regions. In an embodiment, the metal bridge 330 can be formed at location of the solar cell 300A where there is reduced light absorption and/or electrical collection (e.g., at dead-space regions). In an example, the metal bridge 330 can be formed at an edge 335 or near an edge 335 of the solar cell 300A.

In an embodiment, the metal bridge 330 can have a width configured to provide negligible contribution to resistance (e.g., ohmic resistance). In an example, the metal bridge 330 can have a width approximately in the range of 10 microns to 1 millimeter. In one embodiment, the metal bridge 330 can have a thickness of greater than approximately 25 microns. In one embodiment, the thickness of the metal bridge 330, e.g., a copper bridge, can be approximately in the range of 1-50 microns. In some embodiments, the metal bridge 330 can be configured to prevent power loss otherwise associated with silicon cracking in a solar cell by holding the sub-cells together. In an example, the metal bridge 330 can provide mechanical and/or structural support between sub-cells, e.g., in addition to the mechanical and/or structural support provided by the metallization structure 304. In one embodiment, the metal bridge 330 can be perpendicular to a portion 323 used to hold the multi-cell design together where each of the sub-cells 310-319 meet. Embodiments described herein provide a metal structure 304 including a metal bridge 330 (e.g., by plating, or foil, or ribbon, etc.) that is bonded to a full-area wafer having sub-cells. The metal structure 304 can be patterned such that the sub-cell interconnects, e.g., portions 323, can be formed in the same operation as the metallization structure 304. In one embodiment, the metal bridge 330 can be connected, e.g., in electrical connection, to a first busbar 326. In an example, the metal bridge 330 can extend from the first busbar 326. In an embodiment, the first contact pad 332 can be connected to the first busbar 326 through the metal bridge 330. In an embodiment, the metal bridge 330 can include the first contact pad 332. In an example, the metal bridge 330 can electrically connect the first contact pad 332 to the first bus bar 326.

In an embodiment, the first contact pad 332 can be adjacent to a second contact pad 334. In one embodiment, the metal bridge 330 can extend from the first busbar 326 toward the second busbar 328, allowing for the first and second contact pads 332, 334 to be located adjacent 337 to one another. In an embodiment, the second busbar 328 can include the second contact pad 334. In an embodiment, the first busbar 326 can be located at a first location 341 and the second bus bar located 328 at a second, different, location 343. In an example, as shown in FIG. 6, the first busbar 326 can be located at lower side 341 and the second busbar 328 can be located at an upper side 343 of the solar cell 300A. In some embodiments, another busbar 329 can extend from the first contact pad 332, where metal fingers can extend from the busbar 329. In an embodiment, the busbar 329 can allow for additional electrical collection at a region adjacent to the first contact pad 332.

In an embodiment, in contrast to the embodiment of FIG. 5, the first contact pad 332 can be located beside (e.g., adjacent, next to, etc.) to the second contact pad 334, as shown in FIG. 6. In an embodiment, the first and second contact pad 332, 334 can be located at a same location 337 on the solar cell 300A. In an example, both the first and second contact pads 332, 334 can be located at a corner 337 of the solar cell 300A, as shown.

Some advantages of forming adjacent contact pads 332, 334 can include reduced complexity of wiring (e.g., fewer parts), insulation for USB charging, and/or DC electronic applications. In an example, contact pads can be brought into close proximity to reduce and/or eliminate the requirement for external wiring, insulation, and/or to simplify the integration of electrical components. Another advantage can include allowing for clipping to electrical interconnects used in plating bath processes. Yet another advantage can include simplifying test applications, where it can be practical to group test pinning of the contact pads at a single location, e.g., location 337. Although, the first and second contact pad 332, 334 are shown to be located on a corner of the solar cell 300A, both the first and second contact pads 332, 334 can be located at other locations of the solar cell. In an example, as shown in FIG. 7A, the first and second contact pads can be located approximately along a central location of the solar cell.

Referring again to FIG. 6, the voltage of the solar cell 300A can be 10× that of an individual sub-cell. In an example, the solar cell 300A can have a combined voltage of approximately 6.3Vmp, e.g., each of the sub-cells 310-319, can have a voltage of approximately 0.63V. The current in the solar cell 300A can be approximately $\frac{1}{10}$th the current of the original cell 200 of FIG. 4 (e.g., about 0.5 A). The voltage can be scaled higher to allow for a minimum voltage threshold to be maintained even in low-light, shading, off-angle, or indoor applications. The solar cell 300A, in an embodiment, can be used directly or indirectly to power a USB port for consumer charging applications.

Figure 7A:
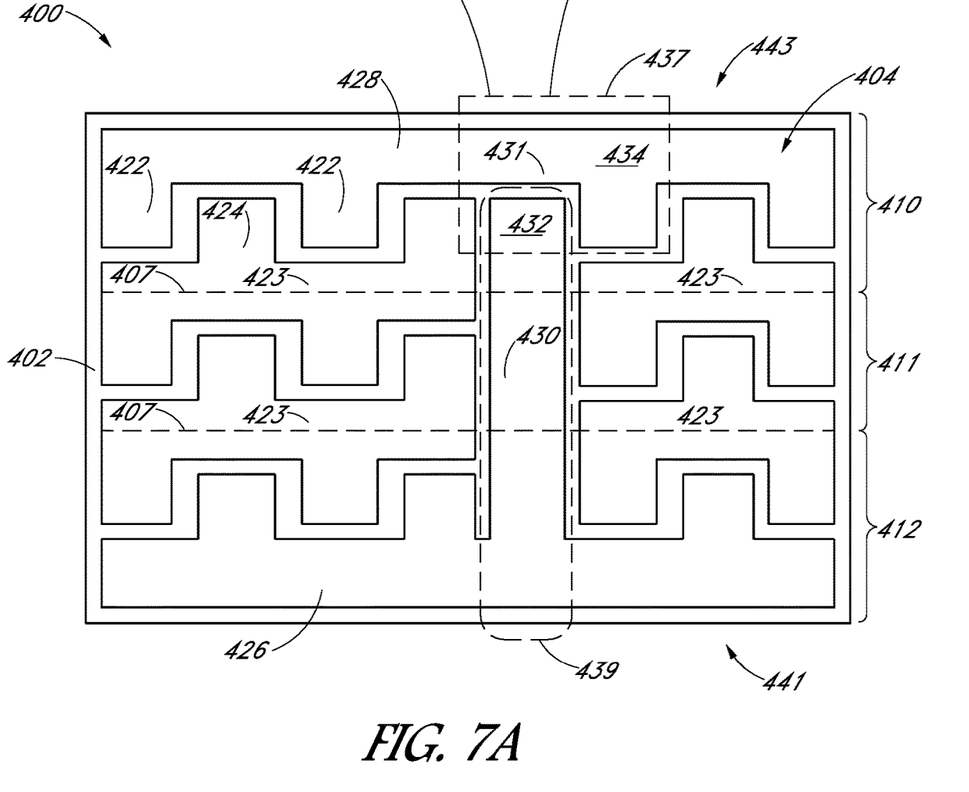
FIGS. 7A, 7B and 7C illustrate a plan view from the metallization side of still another solar cell that has been diced into three connected sub-cells, in accordance with an embodiment of the present disclosure.
Figures 7B, 7C:
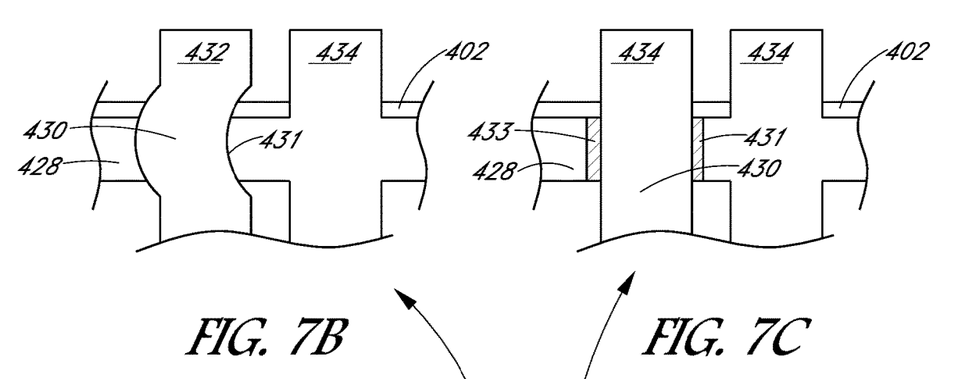

FIGS. 7A, 7B and 7C illustrate a plan view from the metallization side of a solar cell 400 that has been diced into three sub-cells, in accordance with an embodiment of the present disclosure. In an embodiment, the solar cell 400 is substantially similar to the solar cells 200A, 300A of FIGS. 5 and 6. As shown, the solar cell 400 has similar reference numbers to elements of the solar cell 200A, 300A where like reference numbers refer to similar elements throughout the figures. In an embodiment, the structure of the solar cell 400 is substantially similar to the structure of the solar cell 200A, 200A, 300A of FIGS. 5 and 6, except as described below. In an example, the solar cell 400 can include a metal bridge 430 located along a central location 439 of a substrate 402, where the metal bridge 430 can provide structural support and provide for an electrical connection between a first contact 432 pad and a first bus bar 426. Therefore the description of corresponding portions of FIGS. 5 and 6 applies equally to the description of FIGS. 7A, 7B and 7C.

With reference to FIG. 7A, in an embodiment, the solar cell 400 can include a metallization structure 404. In an embodiment, the solar cell 400 can include a metallization structure 404 corresponding to the metallization structure of 104 of FIGS. 1-3. In an embodiment, the metallization structure 404 can include a first and second busbar 426, 428. In an embodiment, the first busbar 426 can be located at a first location 441 and the second bus bar located 428 at a second, different, location 443. In an example, as shown in FIG. 7, the first busbar 426 can be located at lower side 441 and the second busbar 428 can be located at an upper side 443 of the solar cell 400.

Although, three sub-cells 410, 411, 412 are shown, multiple sub-cells can be used, e.g., the solar cell 400 can include one, two, three, more or less sub-cells. The metallization structure 404 can include a portion 423 used to hold the multi-cell design together where each of the sub-cells meet (e.g., along the groove 407).

In an embodiment, the metal bridge 430 can extend from the first busbar 426 as shown in FIG. 7A. In an embodiment, a first contact pad 432 can extend from the first metal bridge 430. In an embodiment, the second busbar 428 can include a second contact pad 434. In an embodiment, the first contact pad 432 can be located adjacent 437 to the second contact pad 434, as shown. In an embodiment, the metallization structure 404 including the metal bridge 430 is substantially similar to the metallization structure 304 and the metal bridge 330 of the solar cell 300A of Figure and 6, therefore the description of corresponding portions of FIG. 6 applies equally to the description of FIGS. 7A, 7B and 7C. In an example, the metal bridge 440 can have width approximately in the range of 10 microns to 1 millimeter and/or have a thickness approximately in the range of 1-50 microns (e.g., a copper bridge).

Referring to FIG. 7B, in an embodiment, the metal bridge 430 can extend over a portion 431 of the first busbar 428, as shown. In an embodiment, the first and second contact pads 432, 434 can extend off the substrate 402, e.g., off the cell.

With reference to FIG. 7C, in an embodiment, there is shown an insulating region 433 formed over a portion 431 of the second busbar 428. In an embodiment, the insulating region 433 allows the first contact pad 432 to extend over the second busbar 428 without contacting the first busbar 428. In an example, the insulating region 433 can be polyimide. In an embodiment, the first and second contact pads 432, 434 can extend off the substrate 402, e.g., off the cell.

Figure 8:
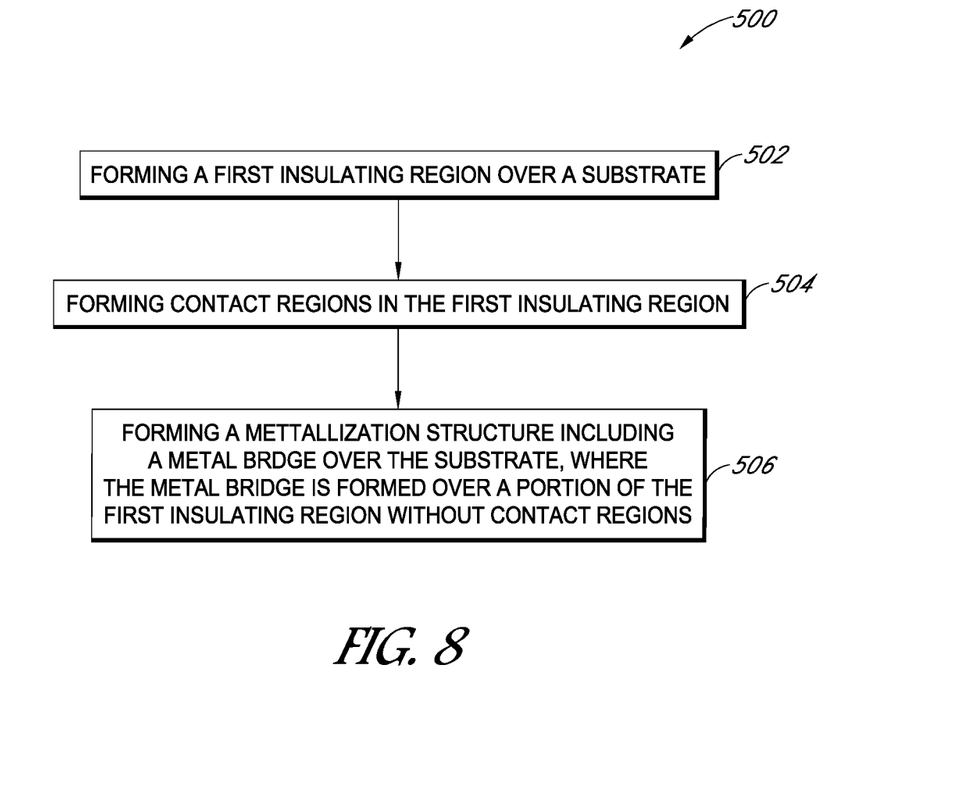
FIG. 8 is a flowchart representing operations in a method of fabricating a solar cell, in accordance with an embodiment of the present disclosure.

Turning now to FIG. 8, a method for fabricating a solar cell is shown, according to some embodiments. In various embodiments, the method 500 of FIG. 8 can include additional (or fewer) blocks than illustrated. For example, in some embodiments, subsequent to step 506, a scribing process can be performed to separate one sub-cell from another sub-cell.

Figure 9:
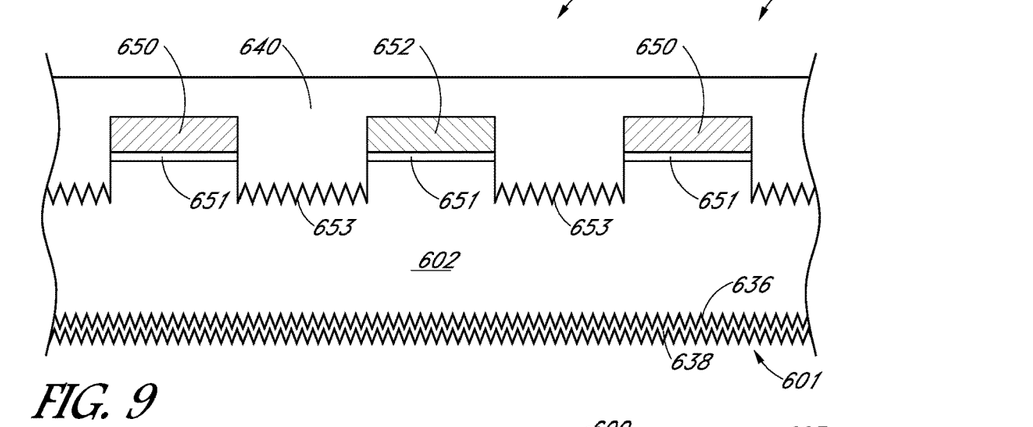
FIGS. 9-11 illustrates a cross-sectional view of a solar cell during the process of FIG. 8, in accordance with an embodiment of the present disclosure.

Referring to FIG. 9, and corresponding operation 502 of the flowchart of FIG. 8, a first insulating region can be formed over a substrate 602, according to some embodiments. In an embodiment, the solar cell 600 can include a substrate 602. In an embodiment, the substrate 602 can be a semiconductor substrate, e.g., silicon substrate. In some embodiments, the silicon substrate can be cleaned, polished, planarized and/or thinned or otherwise processed prior to the formation of the first insulating region 640. In an embodiment, the silicon substrate can be single-crystalline or a multi-crystalline silicon substrate. In an embodiment, the silicon substrate can be an N-type or a P-type silicon substrate. In an embodiment, a solar cell 600 can have a front side 601 which faces the sun during normal operation and a back side 603 opposite a front side 601.

In an embodiment, a first insulating region 640 can be formed over a first surface, e.g., the back side 603, of the substrate 602, as shown. In an embodiment, the first insulating region 640 can be a dielectric region. In an example, the first insulating region 640 can be an anti-reflective coating. In one example, the first insulating region 640 can be silicon nitride. In one embodiment, the first insulating 640 can be polyimide or an inorganic laser buffer (e.g., titanium oxide). In some embodiments, more than one insulating region, e.g., a second insulating region, can be formed over the first insulating region. In an embodiment, the second insulating region can be a dielectric region, anti-reflecting region, silicon nitride, polyimide, and/or an inorganic laser buffer (e.g., titanium oxide).

In an embodiment, prior to the formation of the first insulating region 640, a semiconductor region can be formed in or above the substrate 602. In an example, a first semiconductor region 650 can include an N-type doped region. In one example, a second semiconductor region 652 can include a P-type doped region. In an embodiment, the first and second semiconductor regions 650, 652 can be in the substrate 602. In an embodiment, the first and second semiconductor regions 650, 652 can be formed over the substrate 602. In an example, the first and second semiconductor regions 650, 652 can be doped polysilicon regions. In an embodiment, the doped polysilicon regions can be formed over the substrate. In one embodiment, a dielectric region 651 (e.g., a tunnel oxide) can be formed between the doped polysilicon regions and the substrate.

In an embodiment, a separation region 653 can separate doped regions 650, 652 of different polarity (e.g., a positive and a negative doped regions) from contacting. In some embodiments, as shown in FIG. 9, the separation region 653 can include a trench region, where the trench region can be a partially etched region of the silicon substrate (e.g., substrate 602). In some embodiments, the trench region can be configured to absorb light from the back side 603 of the solar cell 600. In some embodiments, the separation region 653 need not be formed.

In an embodiment, the front side 601 of the solar cell 600 can be a textured surface 636 as shown in FIG. 9. In an embodiment, a hydroxide-based wet etchant can be used to form at least a portion of the textured surface 636 and/or to texturize exposed portions of the substrate 602. A textured surface may be one which has a regular or an irregular shaped surface. In an example, a regular shaped surface can be a smooth and/or planarized surface. In one example, an irregular shaped surface can be a rough, uneven, and/or a non-planar surface. In an embodiment, the textured surface 636 at the front side 601 of the solar cell 600 can be configured to scatter incoming light, where the light scattered from the front side 601 of the solar cell 600 can decrease the amount of light reflected off of the front side 601 and, thus, increase the light collected at the front side 601 of the solar cell 600. In an embodiment, front dielectric region 638 can be formed over the front side 601. In an embodiment, the front dielectric region can be an anti-reflective region (ARC). In one embodiment, the front dielectric region 638 can be silicon nitride.

Figure 10:
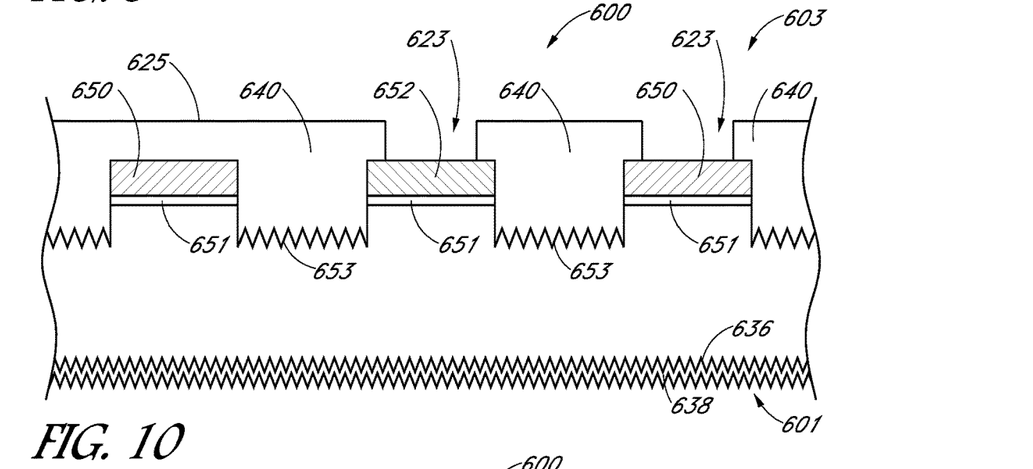

Referring to FIG. 10, and corresponding operation 504 of the flowchart of FIG. 8, contact regions 623 can be formed in the first insulating region 640, according to some embodiments. In an example, the contact opening 623 can be formed by laser ablation and/or by a mask and etch process, among others. In an embodiment, some portions 625 of the first insulating region 640 can remain contact-free, e.g., without any contact regions formed, as shown in FIG. 10.

Figure 11:
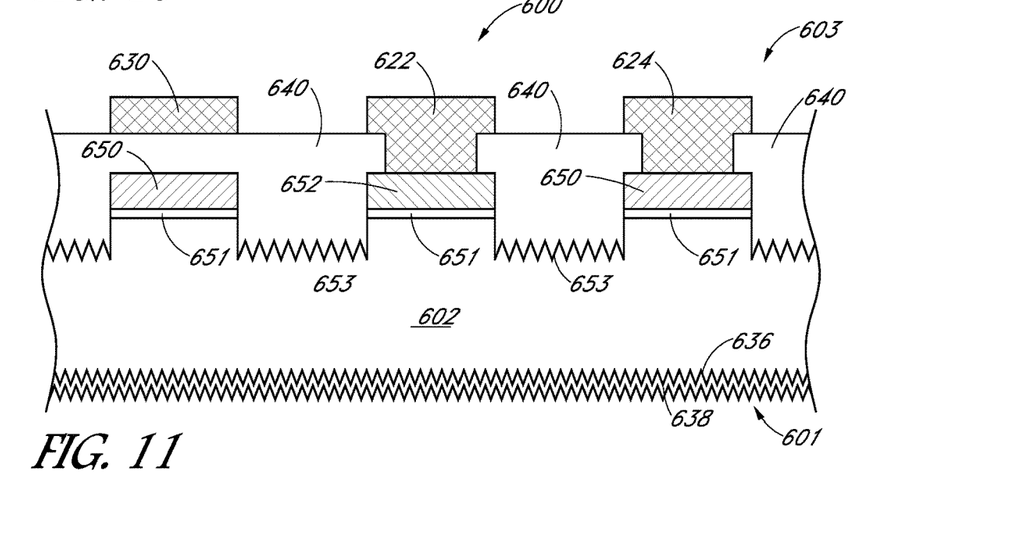

Referring to FIG. 11, and corresponding operation 506 of the flowchart of FIG. 8, a metallization structure can be formed over the substrate, according to some embodiments. In an embodiment, forming the metallization structure can include forming a metal bridge 630. In an embodiment, the metallization structure and the metal bridge 630 can be formed in substantially the same process. In an example, the metal structure and metal bridge can be formed in the same plating, printing and/or metal bonding process (e.g., metal bonding process as in the case of a foil). In some embodiments, forming the metallization structure can include forming a first and second busbar (e.g., any of 326, 328, 426, 428 of FIGS. 6 and 7A, 7B and 7C, respectively). In an embodiment, forming the metallization structure can include forming first and second contact fingers 622, 624. In an embodiment, the metallization structure and the first and second contact fingers 622, 624 can be formed in substantially the same process. In an example, a first contact finger 622 can be formed over the first semiconductor region 650. In one example, a second contact finger 624 can be formed over the second semiconductor region 652. In an example, the metal bridge 630 can be formed over the contact-free region 625 of the first insulating region 640, as shown in FIG. 11. In one embodiment, a second insulating region can be formed between the first insulating region 640 and the metal bridge 630. In an embodiment, the metal bridge can be electrically insulated from the substrate 202. As used herein, the contact fingers 622, 624 and metal bridge 630 can correspond to the contact fingers 322, 324, 422, 424 and the metal bridge 330, 430 of FIGS. 6, 7A, 7B and 7C respectively. In an embodiment, forming the metallization structure can also include forming contact pads (e.g., any of 332, 334, 432, 434 of FIGS. 6 and 7A, 7B and 7C, respectively).

In an embodiment, forming the first and second contact pads can include forming the first contact pad adjacent to the second contact pad. In one embodiment, the first contact pad can be of an opposite polarity than the second contact pad, where the first contact pad can be electrically coupled to the first busbar and the second contact pad can be electrically connected to the second busbar. In an embodiment, forming the metal structure can include performing a plating process and/or a metal bonding process (e.g., metal bonding process as in the case of a foil).

In some embodiments, the metal structure can be formed by plating, printing, by use of a bonding process, or may be fabricated by a deposition, lithographic, and etch approach. In an embodiment, the metal structure can include a plated metal or a metal foil. In an example, the metal structures described herein can include copper or aluminum. (e.g., plated copper or an aluminum foil).

In an embodiment, subsequent to forming the metallization structure at 506, the semiconductor substrate can be scribed. In an embodiment, the scribing can include scribing from a second, opposite, surface, e.g., a front side 601, of the substrate 602, the scribing stopped by and exposing portions of the metallization structure from the second surface. In one embodiment, the scribing can include performing a laser ablation process as described in detail in FIGS. 1-3, 12 and 13.

Figure 12:
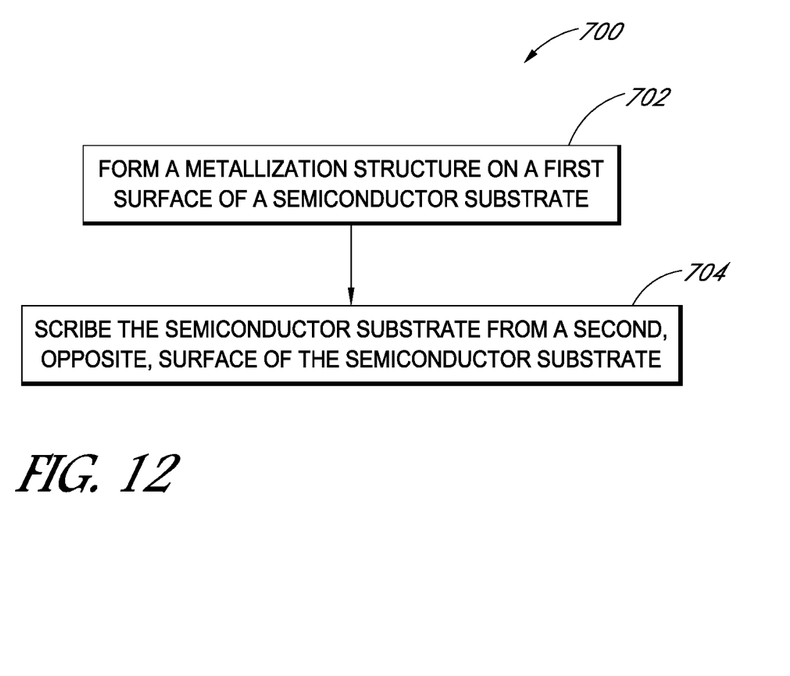
FIGS. 12 and 13 illustrate flowcharts representing operations in a method of fabricating a solar cell using singulation to form sub-cells, in accordance with an embodiment of the present disclosure.
Figure 13:
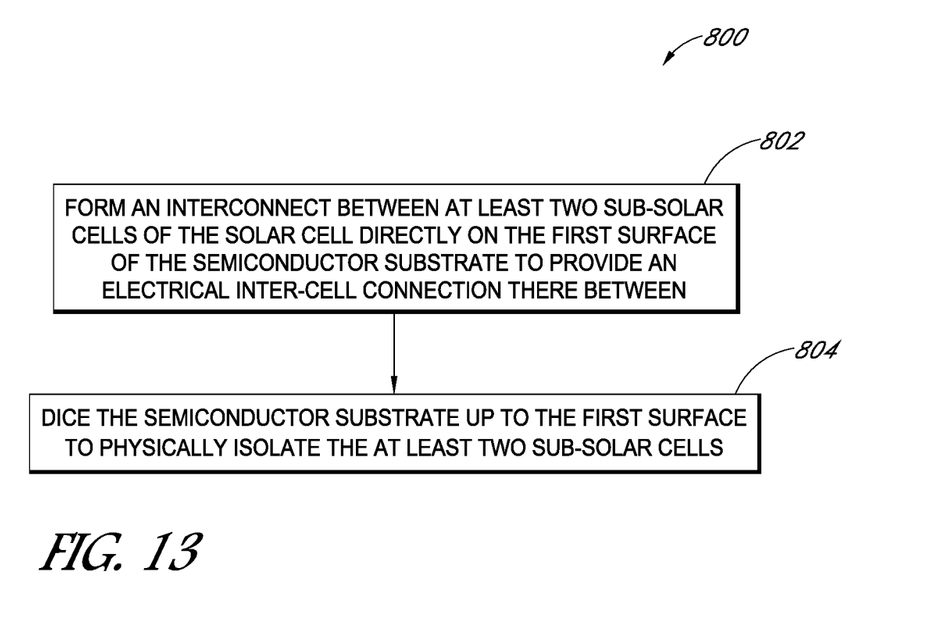

With reference now to flowchart 700 of FIG. 12, in an embodiment, a method of fabricating a solar cell involves forming a metallization structure on a first surface of a semiconductor substrate, as shown in operation 702 of flowchart 700. The method then involves scribing the semiconductor substrate from a second, opposite, surface of the semiconductor substrate, as shown in operation 704 of flowchart 700. In one such embodiment, the scribing is stopped by and exposing portions of the metallization structure from the second surface (as shown in FIGS. 1-3).

In an embodiment, the scribing is stopped by interconnect metal of the metallization structure. In other embodiments, however, a damage buffer is used to protect the metal of the metallization structure. In one such embodiment, the damage buffer is an inorganic laser buffer (e.g., titanium oxide), as described above. In another embodiment, the damage buffer is a metal distinct from the metal of the metallization structure. In another embodiment, the damage buffer is mesh material for through plating. In the last example, since the cracking/separation of the silicon could crack or damage the metal and thereby reducing its reliability, there are several options such as printing or taping a damage buffer prior to metallization to act as a crack/laser stop.

In an embodiment, forming the metallization structure on the first surface of the semiconductor substrate involves patterning a metal foil formed on the first surface of the semiconductor substrate. In other embodiments, however, the metallization structure is formed by printing a metal, plating a metal or stack of metals, or by a metal deposition and etch process. In any case, in an embodiment the metallization structure is formed to have mechanical properties sufficient to bridge two sub-cells together through all reliability testing performed in the fabrication and test procedure. As discussed above, the metallization structure can include a metal bridge which can provide additional mechanical and/or structural support as well as connect a contact pad on one end of the cell to a busbar on another end of the cell.

In an embodiment, the scribing involves scribing with a laser. However, it is to be appreciated that a mechanical scribing process may be implemented instead of or in conjunction with a laser scribing process. For example, in a particular embodiment, a partial laser scribe is performed, followed by breaking or sawing with depth control.

In an embodiment, the method of cell fabrication further involves texturizing the second surface (light-receiving surface) of the semiconductor substrate prior to scribing the semiconductor substrate. In one such embodiment, performing the operations in this order can mitigate dicing damage. In one such embodiment, a partial grooving of the wafer is first performed, and then any damage is removed during silicon etch process (e.g., texturing). However, in other embodiment, the scribing may be performed and then a subsequent wet etch is implemented. In any case, texturizing of the light-receiving surface of the solar cell can, in one embodiment, involve texturizing using a hydroxide-based etch process. It is to be appreciated that a texturized surface may be one which has a regular or an irregular shaped surface for scattering incoming light, decreasing the amount of light reflected off of the light-receiving surface of the solar cell. Additional embodiments can include formation of a passivation or anti-reflective coating layer on the light-receiving surface.

With reference now to flowchart 800 of FIG. 9, in an embodiment, a method of fabricating a solar cell including a semiconductor substrate having a first surface involves forming an interconnect between at least two sub-solar cells of the solar cell directly on the first surface of the semiconductor substrate to provide an electrical inter-cell connection there between, as shown in operation 802 of flowchart 800. The method then involves dicing the semiconductor substrate up to the first surface to physically isolate the at least two sub-solar cells, as shown in operation 804 of flowchart 800.

In an embodiment, forming the interconnect between at least two sub-solar cells of the solar cell further involves forming a metallization structure on the first surface of the semiconductor substrate of the solar cell. In an embodiment, dicing the semiconductor substrate further involves scribing the semiconductor substrate from a second, opposite, surface of the semiconductor substrate. In one such embodiment, the scribing is stopped upon exposing portions of the metallization structure from the second surface.

In an embodiment, scribing the semiconductor substrate further involves forming a groove between the at least two sub-solar cells such that the metallization structure electrically couples portions of the at least two sub-solar cells. In that embodiment, the method further involves forming an encapsulating material in the groove.

In an embodiment, dicing the semiconductor substrate further involves forming at least one diode in each of the at least two sub-solar cells. Each of the at least two sub-solar cells are formed to have approximately a same voltage characteristic and approximately a same current characteristic. In one such embodiment, forming at least one diode in each of the at least two sub-solar cells further involves forming a P-type dopant region and a N-type dopant region in the at least one diode of each of the at least two sub-solar cells, forming a first metal contact to the P-type dopant region, and forming a second metal contact to the N-type dopant region.

In an embodiment, the metallization structure is formed substantially simultaneously to forming of the metallization structure by plating one or more metal films on portions of the first surface of the semiconductor substrate. In one such embodiment, the metallization structure is formed in a same process operation used to plate one or more metal films on portions of the first surface of the semiconductor substrate. However, in other embodiments, forming the metallization structure involves patterning a metal foil formed on the first surface of the semiconductor substrate. In an embodiment, the patterning can include forming the metal bridge discussed above. In an embodiment, the method further involves, prior to scribing the semiconductor substrate, texturizing the second surface of the semiconductor substrate.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. Furthermore, it is to be understood that, where N+ and P+ type regions are described specifically, other embodiments contemplated include a switched conductivity type, e.g., P+ and N+ type regions, respectively.

Embodiments can be implemented to enable scalable voltage and current designs, including higher voltage designs, such as previously described for 5V USB applications, or 12V, 24V, or 48V battery applications. One or more embodiments involve use of a standard cell fabrication process without altering fab modules already in place for conventional cell fabrication. There may be no need for special handling or use of additional sub-cell interconnections. Power loss due to metal grid resistance can be reduced proportional to the square of the length of the metal grid finger. Finally, efficiency benefits may be achieved based on lower current and potentially more reliable cell fabrication.

Thus, solar cells having a plurality of sub-cells coupled by metallization structures including a metal bridge, and singulation approaches to forming solar cells having a plurality of sub-cells coupled by metallization structures, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
    a plurality of sub-cells, each of the sub-cells comprising a singulated and physically separated semiconductor substrate portion, wherein adjacent ones of the singulated and physically separated semiconductor substrate portions have a scribe there between;
    a metallization structure comprising a first busbar and a second busbar, wherein a portion of the metallization structure couples ones of the plurality of sub-cells, wherein the scribe between adjacent ones of the singulated and physically separated semiconductor substrate portions exposes a portion of the metallization structure, and wherein the first busbar and the second busbar are along a first direction, the metallization structure bonded to a back surface, opposite a light-receiving surface, of each of the plurality of sub-cells, wherein the metallization structure electrically bridges at least two of the plurality of sub-cells;
    a first contact pad adjacent to a second contact pad, wherein the first contact pad is of an opposite polarity than the second contact pad and wherein the first contact pad is electrically coupled to the first busbar and the second contact pad is electrically coupled to the second busbar; and
    a metal bridge formed over a contact-free region of the solar cell and wherein the metal bridge electrically couples to the first contact pad to the first bus bar, wherein the metal bridge is along a second direction substantially orthogonal to the first direction.

2. The solar cell of claim 1, wherein the first busbar is located at a first location and wherein the second bus bar located at a second, different, location.

3. The solar cell of claim 1, wherein the metal bridge is located along an edge of the solar cell.

4. The solar cell of claim 1, wherein the metal bridge is configured to provide structural support to the solar cell.

5. The solar cell of claim 1, wherein the metal bridge is formed perpendicular to the scribe.

6. The solar cell of claim 1, wherein the metal bridge has a width approximately in the range of 10 microns to 1 millimeter.

7. The solar cell of claim 1, wherein the metal bridge has a thickness approximately in the range of 1-50 microns.

8. The solar cell of claim 1, wherein the metal bridge comprises a plated metal or a metal foil.

9. The solar cell of claim 1, wherein the metal bridge comprises copper or aluminum.

10. A solar cell, comprising:
    a plurality of sub-cells, each of the sub-cells comprising a singulated and physically separated semiconductor substrate portion, wherein adjacent ones of the singulated and physically separated semiconductor substrate portions have a scribe there between; and
    a metallization structure comprising a first busbar and a second busbar, wherein a portion of the metallization structure couples ones of the plurality of sub-cells, wherein the scribe between adjacent ones of the singulated and physically separated semiconductor substrate portions exposes a portion of the metallization structure, and wherein the first busbar and the second busbar are along a first direction, the metallization structure bonded to a back surface, opposite a light-receiving surface, of each of the plurality of sub-cells, wherein the metallization structure electrically bridges at least two of the plurality of sub-cells;
    a first contact pad adjacent to a second contact pad, wherein the first contact pad is of an opposite polarity than the second contact pad and wherein the first contact pad is electrically coupled to the first busbar and the second contact pad is electrically coupled to the second busbar;
    a first insulating region formed over a first surface of the solar cell, wherein the insulating region includes portions with and without contact regions; and
    a metal bridge formed over the first insulating region without contact regions, wherein the metal bridge electrically couples the first contact pad to the first bus bar, wherein the metal bridge is along a second direction substantially orthogonal to the first direction.

11. The solar cell of claim 10, wherein the first insulating region is a dielectric region.

12. The solar cell of claim 10, wherein the first insulating region comprises silicon nitride.

13. The solar cell of claim 10, wherein the first insulating region comprises polyimide or an inorganic laser buffer.

14. The solar cell of claim 10, further comprising a second insulating region formed over the first insulating region, wherein the second insulating region is formed between the metal bridge and the first insulating region.

15. The solar cell of claim 14, wherein the second insulating region comprises polyimide or an inorganic laser buffer.

\* \* \* \* \*